United States Patent
Grosse

(10) Patent No.: US 10,247,890 B2
(45) Date of Patent: Apr. 2, 2019

(54) METHOD OF ADJUSTING THE PARALLELISM OF A FIBER BLOCK WITH A CHIP SURFACE

(71) Applicant: Commissariat à l'Energie Atomique et aux Energies Alternatives, Paris (FR)

(72) Inventor: Philippe Grosse, Sassenage (FR)

(73) Assignee: Commissariat à l'Energie Atomique et aux Energies Alternatives, Paris (FR)

(*) Notice: Subject to any disclaimer, the term of this patent is extended or adjusted under 35 U.S.C. 154(b) by 0 days.

(21) Appl. No.: 15/916,495

(22) Filed: Mar. 9, 2018

(65) Prior Publication Data

US 2018/0259727 A1 Sep. 13, 2018

(30) Foreign Application Priority Data

Mar. 10, 2017 (FR) .................................... 17 51998

(51) Int. Cl.
*G02B 6/42* (2006.01)
*H01L 21/66* (2006.01)
*G01B 21/16* (2006.01)
*G01M 11/00* (2006.01)
*G01L 1/04* (2006.01)

(52) U.S. Cl.
CPC .......... *G02B 6/4224* (2013.01); *G01B 21/16* (2013.01); *G02B 6/422* (2013.01); *G02B 6/4226* (2013.01); *H01L 22/24* (2013.01); *G01L 1/044* (2013.01); *G01M 11/30* (2013.01); *G02B 6/4227* (2013.01)

(58) Field of Classification Search
CPC .... G02B 6/4224; G02B 6/4226; G02B 6/422; G02B 6/4227; G01B 21/16; H01L 22/24; G01M 11/30; G01L 1/044
See application file for complete search history.

(56) References Cited

U.S. PATENT DOCUMENTS

| 6,325,551 B1 | 12/2001 | Williamson et al. |
| 6,556,751 B1 | 4/2003 | Lee et al. |
| 2002/0110335 A1* | 8/2002 | Wagner .................. G02B 6/422 385/89 |
| 2003/0019516 A1 | 6/2003 | Kim et al. |

(Continued)

FOREIGN PATENT DOCUMENTS

KR 20040019516 A 3/2004

OTHER PUBLICATIONS

Preliminary Search Report in French Application No. 1751998 dated Oct. 16, 2017, 2 pages.

*Primary Examiner* — Karen Kusumakar
(74) *Attorney, Agent, or Firm* — Moreno IP Law LLC

(57) ABSTRACT

A method of adjusting the parallelism of a surface of a block of optical fibers with a surface of a semiconductor chip or wafer laid on an XY table, including the steps of: a) providing a sensor rigidly attached to the XY table and a handling arm supporting the block, said surface facing the XY table; b) for each of three non-aligned points of the surface of the block, displacing with respect to each other the XY table and the block in the X and/or Y directions to place the sensor opposite the point, and estimating, with the sensor, the distance along the Z direction between the point and the sensor; and c) modifying the orientation of the block by means of the handling arm to provide the desired parallelism.

10 Claims, 2 Drawing Sheets

(56) References Cited

U.S. PATENT DOCUMENTS

2004/0052470 A1    3/2004  Kim
2007/0175563 A1*  8/2007  Sato ........................ G02B 6/32
                                                              156/64

* cited by examiner

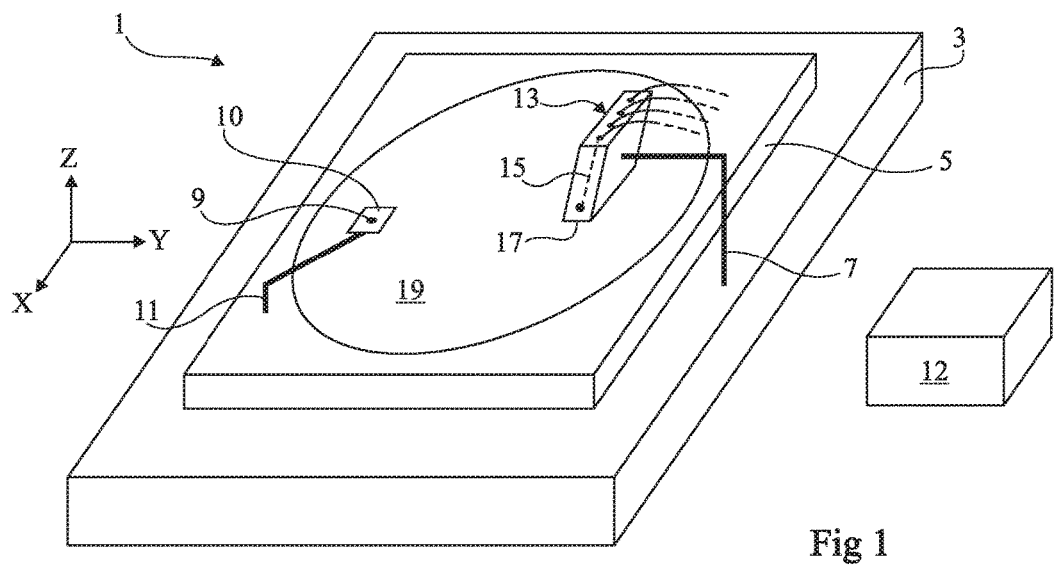
Fig 1
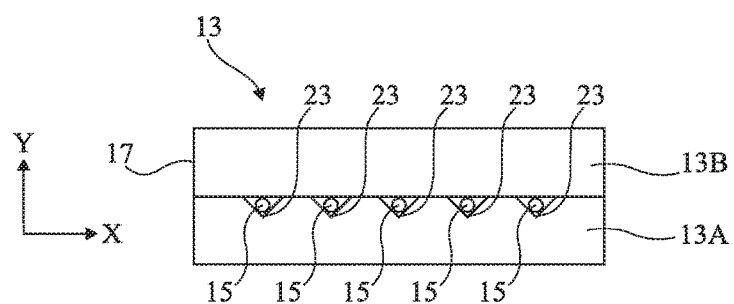
Fig 2A
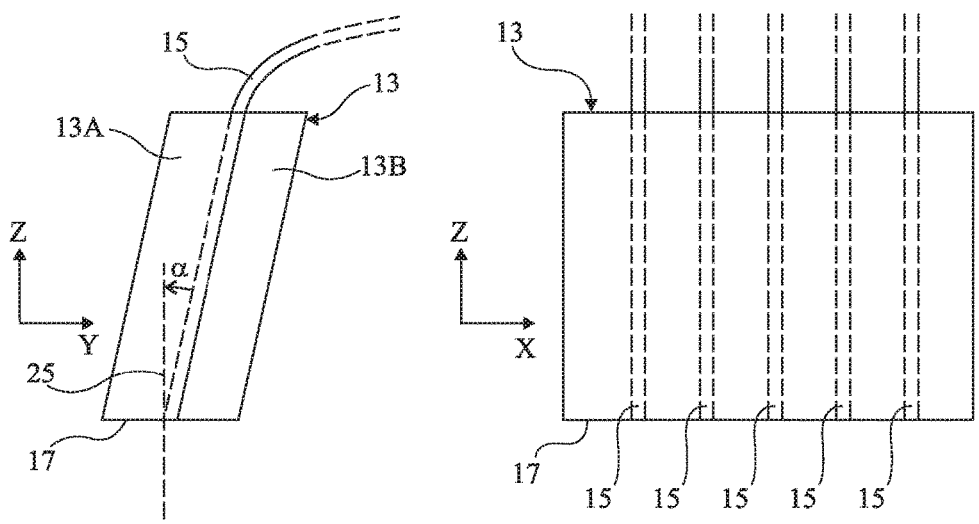
Fig 2B
Fig 2C

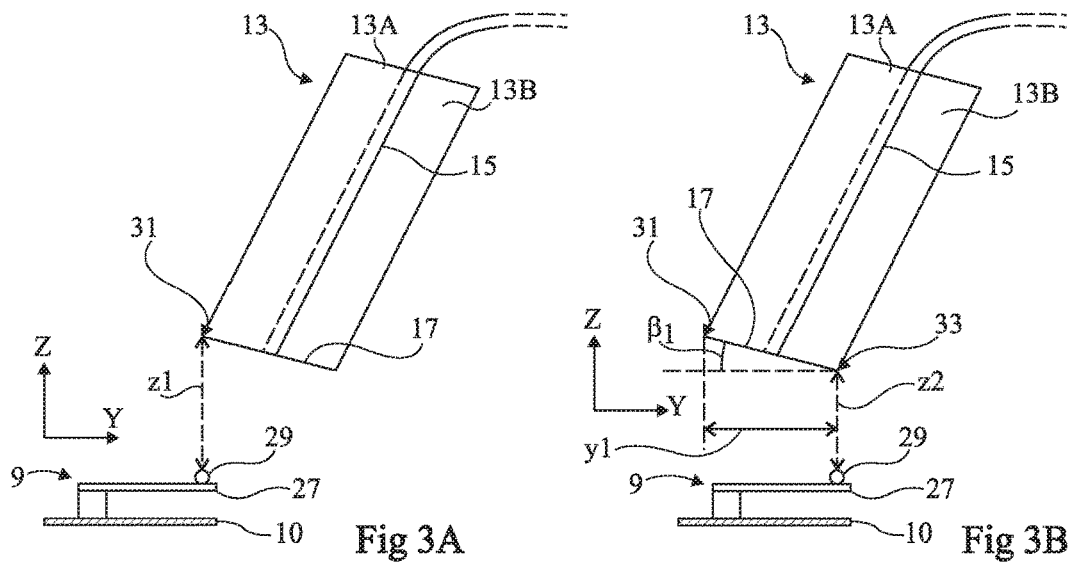
Fig 3A    Fig 3B
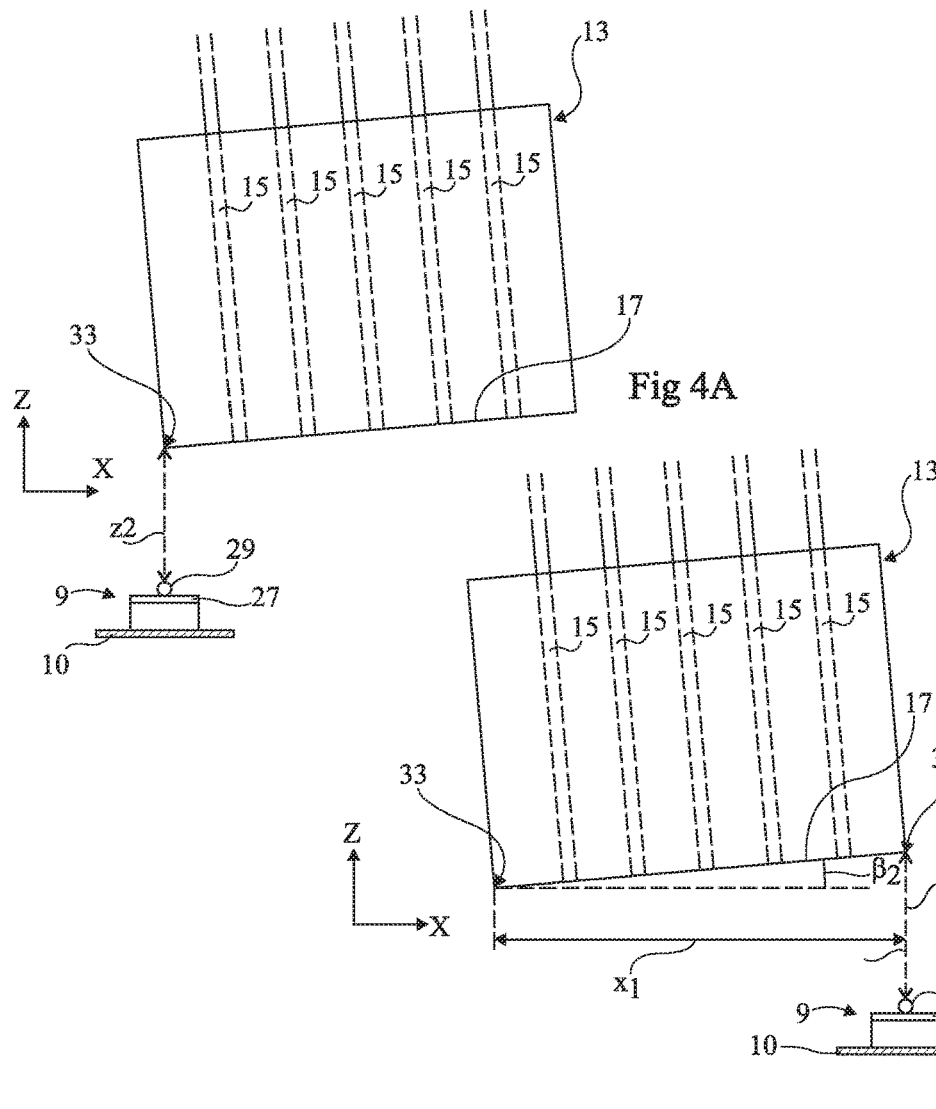
Fig 4A
Fig 4B

METHOD OF ADJUSTING THE PARALLELISM OF A FIBER BLOCK WITH A CHIP SURFACE

CROSS-REFERENCE TO RELATED APPLICATION

This application claims the priority benefit of French patent application number 17/51998, filed on Mar. 10, 2017, the content of which is hereby incorporated by reference in its entirety to the maximum extent allowable by law.

FIELD

The present disclosure relates to a method of adjusting the parallelism of a fiber block with a surface of a chip or semiconductor wafer resting on a XY table. The present disclosure also relates to a test station capable of implementing such a method.

BACKGROUND

Integrated optical circuits are currently manufactured from a wafer of a semiconductor material, or semiconductor wafer, which is then sawn to obtain a plurality of individual chips. Before the sawing step, tests are performed to verify that the optical circuits are functional.

To test an integrated optical circuit, optical signals are supplied to optical inputs of the circuit, and the values of the corresponding output signals are observed, which output signals may be optical signals available at the optical outputs of the circuit. The optical signals are simultaneously supplied to a plurality of optical inputs of the circuit by means of a block of optical fibers, that is, a parallelepipedal block having a plurality of parallel, coplanar, and regularly distributed optical fibers held in place therein. The ends of these fibers are flush with the lower surface of the block and are distributed as optical inputs and/or outputs of the circuit. Thus, by properly positioning the fiber block above the optical inputs and/or outputs, each optical fiber has its end arranged above a corresponding optical input or output.

For the test to be correct, the distances between the ends of the fibers and the corresponding optical inputs or outputs should be identical, for example, to within ±2.5 µm, for all the block fibers. The ends of the fibers all being vertically in line with the lower surface of the block, this surface should be as parallel as possible to the upper surface of the chip or of the semiconductor wafer comprising the optical circuit to be tested. In practice, the semiconductor chip is arranged on the upper surface of an XY table and it is sufficient for the lower surface of the block to be parallel to the upper surface of the XY table.

A known method to adjust the parallelism of these two surfaces is based on the use of a plurality of cameras arranged around the fiber block to view the orientation of its lower surface with respect to the upper surface of the semiconductor chip or of the XY table. The orientation of the block is then adjusted until the surfaces are made substantially parallel. It is however difficult to find a compromise between the enlargement and the field of each camera which enables to simultaneously view the fiber block and the upper surface of the chip or of the table while keeping a sufficient accuracy. It is also difficult to find a compromise between the cost of cameras and their resolution, which conditions the accuracy of the adjustment. This method thus has a low accuracy and a high cost. Further, its implementation may turn out being complex, all the more as transparent materials are difficult to accurately observe with a camera: there are refraction and reflection problems which limit the resolution of the camera and which make the contours fuzzy.

SUMMARY

It would be desirable to have a method of adjusting the parallelism of the fiber block with an XY table which is more accurate, less expensive, and simpler to implement than existing methods.

Thus, an embodiment provides a method of adjusting the parallelism of a surface of a block of optical fibers with a surface of a semiconductor chip or wafer laid on an XY table, comprising the steps of:

a) providing a sensor rigidly attached to the XY table and a handling arm supporting the block, said surface facing the XY table;

b) for each of three non-aligned points of the surface of the block, displacing with respect to each other the XY table and of the block in the X and/or Y directions to place the sensor opposite the point, and estimate, with the sensor, the distance in the Z direction between the point and the sensor; and c) modifying the orientation of the block by means of the handling arm to provide the desired parallelism.

According to an embodiment, the sensor is a contact sensor, step b) comprising, for each point, displacing the block in the Z direction from a reference position to a position where it is placed into contact with the sensor, and determining the distance in the Z direction traveled by the block between the reference and contacting positions.

According to an embodiment, the displacement in the Z direction of the block is ensured by a stepping motor, associated with means for measuring the number of steps.

According to an embodiment, the sensor comprises an element deformable along the Z direction, a device for measuring the deformation along the Z direction, and a contacting element assembled on the deformable element, step b) comprising, for each point, displacing the block along the Z direction until the element deformable along the Z direction is deformed, and determining the distance along the Z direction traveled by the block between the reference position and a position where the point is placed into contact with the contacting element.

According to an embodiment, the contacting element is a ball, the element deformable in the Z direction is a flexible blade and the deformation measurement device is a strain gauge arranged on the blade.

According to an embodiment, at step b), the displacement of the XY table and of the block with respect to each other is performed by displacing the XY table.

According to an embodiment, each point is in the vicinity of a corner of said surface.

According to an embodiment, after each estimation of two distances along the Z direction performed at step b), step c) is partly carried out by modifying the orientation of the block based on the displacement in the X and/or Y direction performed between the two points and on the corresponding difference between distances along the Z direction.

It would also be desirable to have a test station for implementing this method, preferably at least partly automatically.

Thus, an embodiment provides a test station comprising a handling arm and an XY table, capable of implementing the above method.

According to an embodiment, the test station further comprises a control and processing circuit capable of receiving the output signal of the sensor, of storing the distances along the Z direction, and of supplying control signals to the XY table and to the handling arm to automatically implement the method.

The foregoing and other features and advantages will be discussed in detail in the following non-limiting description of specific embodiments in connection with the accompanying drawings.

BRIEF DESCRIPTION OF THE DRAWINGS

FIG. 1 is a simplified perspective view of a test station;
FIGS. 2A to 2C are simplified views of an example of a fiber block used in the test station of FIG. 1; and
FIGS. 3A, 3B, and 4A, 4B schematically illustrate steps of an embodiment of a method of aligning a fiber block with an XY table.

DETAILED DESCRIPTION OF THE PRESENT EMBODIMENTS

The same elements have been designated with the same reference numerals in the various drawings and, further, the various drawings are not to scale. For clarity, only those steps and elements which are useful to the understanding of the described embodiments have been shown and are detailed.

In the following description, terms "upper" and "lower" refer to the position of the concerned elements in the corresponding drawings. Unless otherwise specified, term "approximately" means to within 10%, preferably to within 5%.

FIG. 1 is a simplified perspective view of a test station capable of implementing a method of adjusting the parallelism of an optical fiber block with a surface of a chip arranged on an XY table.

Test station 1 comprises, in an orthonormal reference frame defined by three directions or axes X, Y, and Z, a frame 3 having an XY table 5. The upper surface of XY table 5 is parallel to the plane defined by directions X and Y. Test station 1 comprises a handling arm 7 rigidly attached to frame 3. Test station 1 further comprises a sensor 9 rigidly attached to table 5. Thus, when table 5 is displaced in the X and/or Y directions, sensor 9 is displaced in the same way, parallel to the plane defined by directions X and Y. In this example, the sensor is arranged on a support 10 assembled at the end of an arm 11 attached to table 5. A control and processing circuit 12 receives the output signal of sensor 9 and supplies control signals to handling arm 7 and to XY table 5.

During a test phase, a block 13 of optical fibers 15 is attached to handling arm 7, currently at the level of an end thereof. Block 13 is arranged so that its lower surface 17, having the ends of fibers 15 flush therewith, faces the upper surface of XY table 5. Further, a semiconductor chip 19 is arranged on XY table 5, the upper surface of chip 19 being parallel to the plane defined by directions X and Y.

Handling arm 7 is capable of displacing block 13 at least in direction Z. Handling arm 7 is also capable of modifying the orientation of the block with respect to XY table 5, by applying rotations to block 13 at least around two axes different from axis Z. Handling arm 7 is for example a six-axis handling arm having its end supporting block 13, which is translatably moveable along directions X, Y, and Z and rotatably moveable around axes X, Y, and Z. The translation and rotation displacements of handling arm 7, and the translation displacements of XY table 5 are performed via displacement devices (not shown), for example, stepping motors or micrometer-range adjustment screws. The displacement devices are automatically controlled or driven by the control signals supplied by processing and control circuit 12.

FIGS. 2A, 2B, and 2C are respectively simplified bottom, side, and front views of block 13 of fibers 15 of FIG. 1.

In this example, block 13 is formed of two glass plates 13A and 13B glued to each other. Plate 13A comprises grooves 23 at the level of its surface glued to plate 13B, for example, V-shaped grooves. Each groove 23 has a fiber 15 arranged therein. In this example, block 13 comprises five fibers 15, it being understood that, in practice, block 13 may comprise any number of fibers 15 greater than or equal to two. The optical inputs and outputs of an optical integrated circuit to be tested are currently formed by coupling networks, each of which is arranged at one end of a waveguide. To optimize the coupling of fibers 15 with the coupling arrays, angle α between normal 25 to lower surface 17 of block 13 and the axis of each fiber 15 is selected according to the coupling arrays used, and is for example in the range from 3 to 15°, for example, 8°. As an example, for a block 13 provided with eight fibers 15 distributed with a pitch which, according to current standards, currently is 127 or 250 μm, lower surface 17 of the block for example has a width of approximately 2 mm for a length of approximately 4.5 mm.

An embodiment of a method of adjusting the parallelism of the lower surface of block 13 of fibers 15 with the upper surface of XY table 5, implemented in test state 1, will now be described.

FIGS. 3A, 3B, 4A, and 4B illustrate successive steps of such a method, FIGS. 3A and 3B being side views of sensor 9 resting on support 10 and of block 13 of fibers 15 and FIGS. 4A and 4B being front views of the same elements.

In this embodiment, sensor 9 is a contact sensor. More particularly, sensor 9 comprises an element deformable in the Z direction, for example, a flexible blade 27, and a device for measuring the deformation along the Z direction of this element, for example, a strain gauge, not shown, arranged on the upper or lower surface of blade 27. As a variation, the element deformable along the Z direction and the device for measuring the deformation along the Z direction correspond to a piezoelectric blade. The sensor further comprises a ball 29 or a point resting on the upper surface of flexible blade 27 and enabling to ensure a point contact of sensor 9 with a surface. As an example, blade 27 has a length in the range from 10 to 20 nm, for example, 12 mm, and a width in the range from 3 to 10 mm, for example, 4 mm. Ball 29 is for example made of glass and for example has a diameter in the range from 1.5 to 0.5 mm, for example, approximately 1 mm.

At the step of FIG. 3A, ball 29 of sensor 9 is arranged opposite a point 31 of lower surface 17 of block 13 of fibers 15 by displacing XY table 5, and thus sensor 9, in the X and Y directions. Block 13 is then displaced in the Z direction by means of handling arm 7, from a reference position along the Z direction to sensor 9. From the moment when point 31 and ball 29 are placed into contact, the displacement in the Z direction causes a deformation of blade 27, which is detected, on the output signal of sensor 9, by control and processing circuit 12. The latter then automatically determines distance z1 traveled in the Z direction by block 13 from its reference position to its position of contact with sensor 9. Block 13 is then placed back in its reference position, as shown in FIG. 3A.

At the step of FIG. 3B, ball 29 of sensor 9 is placed opposite a point 33 of lower surface 17 of block 13 of fibers 15 by displacing XY table 5 by a distance y1 in the Y direction. The distance along the Z direction, z2, between ball 29 and point 33 of block 13 in its reference position is determined by circuit 12 similarly to distance z1. Block 13 is then set back to its reference position.

At the steps of FIGS. 4A and 4B, sensor 9, support 10, and block 13 of fibers 15 are shown in front view.

At the step of FIG. 4A, block 15, sensor 9, and support 10 are in the same positions as at the end of the step illustrated in FIG. 3B.

At the step of FIG. 4B, ball 29 of sensor 9 is placed opposite a point 35 of lower surface 17 of block 13 by displacing XY table 5 by a distance x1 in direction X. The distance along the Z direction, z3, between ball 29 and point 35 of block 13 in its reference position is determined by the circuit similarly to distances z1 and z2. Block 13 is then set back to its reference position.

At a next step, not shown, the differences in distances along the Z direction between points 31 and 33 and between points 33 and 35, with respect to sensor 9, are automatically estimated by control and processing circuit 12 based on the stored distances z1, z2, and z3. Knowing the distance differences in the Z direction and distances x1 and y1, and by applying trigonometry formulas, control and processing circuit 12 automatically determines the orientation of surface 17 of block 13 with respect to the upper surface of XY table 5 or of semiconductor chip 19. In practice, control and processing circuit 12 calculates angle (31 between surface 17 of block 13 and XY table 5 in a plane orthogonal to XY table 5 comprising points 31 and 33 (FIG. 3B) and angle (32 between surface 17 of block 13, and XY table 5 in a plane orthogonal to XY table 5 comprising points 33 and 35 (FIG. 4B).

At a next step, not shown, control and processing circuit 12 automatically determines, based on angles (31 and (32, the control signals to be supplied to the devices for rotating arm 7 to modify the orientation of block 13 with respect to the XY table and provide the desired parallelism. In the example described in relation with FIGS. 3A, 3B, 4A, and 4B, this corresponds to applying to the block a rotation of angle β1 around axis X and a rotation of angle β2 around axis Y.

Preferably, in the above-described method, points 31, 33, and 35 of lower surface 17 of block 13 are selected to be close to corners of surface 17. As a result, the displacement distances along the X and Y directions are significant, which limits the influence of a possible absolute displacement error in these directions, and provides a better parallelism adjustment accuracy.

According to an advantage, contact sensors are simple and inexpensive devices and their use is particularly simple and efficient. Indeed, as previously indicated, they may be used to measure the distance between a reference position of the handling arm and a contact position without it being necessary to perform an absolute distance measurement. Preferably, the displacements in the Z direction of the handling arm are ensured by a stepping motor and it will be sufficient, knowing the value of a step, to count the number of steps between the two positions of the handling arm.

According to another advantage, despite their simplicity and their low cost, contact sensors provide measurement accuracies along the Z direction resulting in an adjustment of the parallelism with the require accuracy. In particular, in the case of the previously-described contact sensor 9, it is sufficient to track the time when blade 27 starts being deformed but it is not necessary to accurately know the amplitude of the deformation. As an example, if a sensor formed of a blade of 4 mm×12 mm and a 120-ohm strain gauge (2.5 mm×6 mm) are used, a 5-µm measurement accuracy is obtained, that is, sensor 9 enables to determine angle β1 with an accuracy of 0.06° and angle β2 with an accuracy of 0.015° when surface 17 has the dimensions indicated in relation with FIGS. 2A to 2C.

According to still another advantage, as compared with most distance sensors, contact sensors are not sensitive to the nature of the material(s) of the surface with respect to which the distance is measured.

According to still another advantage, sensor 9 described herein requires no calibration phase.

According to still another advantage, a contact sensor may be roughly positioned without for this to affect the measurement of the distance along the Z axis, conversely to other sensors such as optical sensors, which require being perfectly aligned with the Z axis.

According to still another advantage, the electric power consumption of a contact sensor, particularly of above-described sensor 9, is very low.

The method described hereabove in relation with FIGS. 3A, 3B, 4A, and 4B is likely to have many alternative embodiments.

In a first variation, contact sensor 9 is replaced with another sensor of the distance along the Z direction, for example, an optical distance sensor such as a time-of-flight sensor, a capacitive distance sensor, an inductive distance sensor, a magneto-inductive distance sensor, or an eddy current sensor. In this case, the displacement of block 13 in the Z direction to measure each of distances z1, z2, and z3 may be unnecessary. It is however preferred to use a contact sensor which has the above discussed advantages, the other sensors being generally less simple, more expensive, and more difficult to use. For example, an optical distance sensor of time-of-flight type requires a light emission source and a light receiver, and thus is much more expensive than a contact sensor. Further, the light emission source and the sensor should be synchronized, which make such time-of-flight sensors more complex.

In a second alternative implementation, the orientation of block 13 with respect to XY table 5 is modified after each estimation of a difference in distances along the Z direction between two points with respect to sensor 9. For example, after the steps of FIGS. 3A and 3B, angle β1 is calculated based on distance y1 and on the difference in distances along the Z direction, z1-z2, between points 31 and 33, and a rotation by angle β1 around the X axis is applied to block 13 to adjust the parallelism. Then only are the steps of FIGS. 4A and 4B carried out, a new measurement of distance z2 being performed at the step of FIG. 4A. Angle β2 is then calculated based on distance x1 and on the distance difference along the Z direction, z2-z3, between points 33 and 35, and a rotation by angle β2 around the Y axis is applied to block 13 to correct the parallelism.

In a third alternative implementation, the relations between the orders applied to the devices for rotating arm 7 and the resulting rotation angles are not known. In this case, the above-described method may be implemented by successive approximations. The orientation of block 13 is roughly modified based on angles β1 and β2. The steps of FIGS. 3A to 4B and of rough modification of the orientation of block 13 are then repeated until distance differences along the Z direction and angles β1 and β2 which are zero or nearly zero are obtained.

In a fourth alternative embodiment, block 13 may be displaced along the X or Y direction with respect to XY table 5 and to sensor 9 rather than the other way, as described in relation with FIGS. 3A, 3B, 4A, and 4B. However, when it is not certain that block 13 is displaced parallel to the upper surface of XY table 5, it is preferred to displace along the X and Y directions the assembly of sensor 9 and of XY table 5 with respect to block 13. This ensures that lower surface 17 of block 13 is made parallel to the upper surface of XY table 5.

A specific embodiment and specific alternative embodiments have been described. Other variations and modifications will occur to those skilled in the art. In particular, it will be within the abilities of those skilled in the art to apply the teachings of the present disclosure to the case where, between two measurements of the distance along direction Z, the displacement of the XY table and of the fiber block with respect to each other corresponds to a composition of a displacement along the X direction and of a displacement along the Y direction. Further, the displacement directions between a plurality of measurements of the distance along the Z direction may be non-orthogonal.

The distribution of fibers 15 in block 13 may be different from that described hereabove. Fibers 15 may be non coplanar and/or not be distributed according to a given pitch.

Sensor 9 may be arranged at any selected location provided that it moves along with the XY table. For example, sensor 9 may be arranged on XY table 5 or on semiconductor chip 19.

Of course, at least some of the previously-described steps may be implemented in non-automated fashion.

Further, although three measurement points are sufficient to implement the above method, more than three measurement points may be provided, for example, four measurement points, which may each correspond to a corner of surface 17.

The above method may further be implemented in other applications. Indeed, the fiber block may be replaced with any other element comprising a surface which is desired to be made parallel to the upper surface of the XY table or of a device resting on this table. For example, the above method may be implemented to make a surface of an optical prism parallel to the upper surface of a chip laid on the XY table and comprising a light emission source which is desired to be studied. According to another example, the above method may be implemented in a conditioning station comprising an XY table and a handling arm to achieve, when an integrated optical circuit chip is packaged, the alignment of a fiber block with optical inputs/outputs of the chip.

Various embodiments with various variations have been described hereabove. It should be noted that those skilled in the art may combine various elements of these various embodiments and variations without showing any inventive step. In particular, the four previously-described alternative embodiments may all be combined.

It should further be noted that after having carried out the steps of the above-described method, various steps may be implemented, particularly test steps. Modifications can then be made to test station 1 described in relation with FIG. 1 to implement these steps. For example, in a test phase, to make sure that the distance in the Z direction between semiconductor chip 19 and the lower surface of block 13 remains constant, a sensor of the distance along the Z direction facing semiconductor chip 19 may be attached to the end of arm 7 supporting block 13. Thus, the distance in the Z direction between semiconductor chip 19 and lower surface 17 of block 13 is measured after each displacement and, if need be, corrected by displacing block 13 in the Z direction.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of adjusting the parallelism of a surface of a block of optical fibers with a surface of a semiconductor chip or wafer laid on an XY table, comprising the steps of:
   a) providing a sensor rigidly attached to the XY table and a handling arm supporting the block, said surface facing the XY table;
   b) for each of a set of points of the surface of the block, at least three of which are non-aligned, displacing with respect to each other the XY table and the block in directions X and/or Y to place the sensor opposite the point, and estimate, with the sensor, the distance along the Z direction between the point and the sensor; and
   c) modifying, by taking into account the distances along the Z direction, the orientation of the block by means of the handling arm to provide the desired parallelism.

2. The method of claim 1, wherein the sensor is a contact sensor, step b) comprising, for each point, displacing the block along the Z direction from a reference position to a position where it is placed into contact with the sensor, and determining the distance along the Z direction traveled by the block between the reference and contacting positions.

3. The method of claim 2, wherein the displacement along the Z direction of the block is ensured by a stepping motor, associated with means for measuring the number of steps.

4. The method of claim 2, wherein the sensor comprises an element deformable along the Z direction, a device for measuring the deformation along the Z direction, and a contacting element assembled on the deformable element, step b) comprising, for each point, displacing the block along the Z direction until the element deformable along the Z direction is deformed, and determining the distance along the Z direction traveled by the block between the reference position and a position where the point is placed into contact with the contacting element.

5. The method of claim 4, wherein the contacting element is a ball, the element deformable along the Z direction is a flexible blade, and the deformation measurement device is a strain gauge arranged on the blade.

6. The method of claim 1, wherein, at step b), the displacement of the XY table and of the block with respect to each other is performed by displacing the XY table.

7. The method of claim 1, wherein each point is arranged in the vicinity of a corner of said surface.

8. The method of claim 1, wherein after each estimation of two distances along the Z direction performed at step b), step c) is partly carried out by modifying the orientation of the block based on the displacement in the X and/or Y direction performed between these two points and on the corresponding difference between distances along the Z direction.

9. A test station comprising a handling arm and an XY table, capable of implementing the method of claim 1.

10. The test station of claim 9, further comprising a control and processing circuit capable of receiving the output signal of the sensor, of storing the distances along the Z direction, and of supplying control signals to the XY table and to the handling arm to automatically implement the method.

* * * * *